350-96.24 SR
XR 3,918,392
1 1 U 12R

United States Patent [19]

[11] 3,918,392
[45] Nov. 11, 1975

Gibson et al.

[54] PROGRAMMABLE FIBER OPTIC DISPLAY FOR USE IN TELEVISION TUNERS

[75] Inventors: Richard D. Gibson, Wilbraham; Robert D. Whelan, West Springfield, both of Mass.

[73] Assignee: General Instrument Corporation, Clifton, N.J.

[22] Filed: Feb. 22, 1974

[21] Appl. No.: 444,821

[52] U.S. Cl. ........ 116/124.4; 178/DIG. 2; 325/455; 334/86
[51] Int. Cl.$^2$ ........ H03J 1/04
[58] Field of Search .......... 116/124.4, 124.1, 124 L; 350/96 B; 340/380; 250/222; 334/86–88; 178/DIG. 2; 325/455, 464

[56] References Cited

UNITED STATES PATENTS

| | | | |
|---|---|---|---|
| 2,980,796 | 4/1961 | Mason | 334/88 X |
| 3,163,949 | 1/1965 | Gley | 350/96 R X |
| 3,179,907 | 4/1965 | Brand et al. | 334/87 X |
| 3,353,026 | 11/1967 | Israely | 350/96 B |
| 3,538,312 | 11/1970 | Genältr | 350/96 B X |
| 3,836,911 | 9/1974 | Gibson et al. | 116/124.4 X |
| 3,857,361 | 12/1974 | Gibson et al. | 352/464 X |

*Primary Examiner*—Richard C. Queisser
*Assistant Examiner*—Daniel M. Yasich

[57] ABSTRACT

A display for indicating the channel tuned in a TV tuner, the tuner being effective to select a limited number of channels chosen from a larger number of potential channels, the display having pre-settable adjustable means for causing the display to show the indicia only of the selected channels and to be conditioned by the setting of said adjustable means to display the indicia corresponding to any desired set of chosen channel numerals.

24 Claims, 3 Drawing Figures

3918392
OR IN 116/124.4

PROGRAMMABLE FIBER OPTIC DISPLAY FOR USE IN TELEVISION TUNERS

The present invention relates to channel indicia display devices for use in television receivers or the like and more particularly to a programmable fiber optic channel indicia display device for use with a tuner, such as a UHF tuner, which is capable of displaying a selected number of indicia each corresponding to one of the channels to which the receiver may be tuned.

It has become mandatory under the present FCC regulations for television receiver manufacturers to produce television receivers having UHF tuning capability comparable to the conventional VHF tuning capability. The inclusion of a UHF tuner in a television receiver presents a variety of problems not only pertaining to the design and construction of a low-cost, reliable UHF tuner drive assembly but also relating to the manner in which numerals corresponding to the selected UHF channels are displayed.

Both mechanical and electrical problems are inherent in providing a device capable of tuning to any selected one of the seventy possible channels in the UHF band with sufficient accuracy so as to be able to distinguish in its tuning between any two adjacent channels. Because step-by-step TV tuning has become conventional in conjunction with the twelve channels in the VHF band, for comparable tuning the FCC also requires similar tuning capability in the UHF band, but the much greater number of channels which must be tuned in the UHF band, and the very high precision of tuning which is required, have given rise to special new mechanical arrangements for UHF TV tuners.

With respect to UHF channel indicia display devices, comparable problems are present. Because of space problems, it is not feasible to utilize conventional VHF display techniques with UHF systems due to the much larger number of indicia involved. Since only twelve numbers need be displayed in a VHF receiver, it is feasible to place each of the twelve numbers on a disc or drum, appropriate sections of which may be aligned with a display area in the proper sequence, illuminated and viewed directly. However, the greater number of indicia necessary for the seventy channels in the UHF band prohibit this direct view display method because a display device requiring an acceptable amount of space in the receiver would necessarily have indicia of such small size that direct viewing thereof would be difficult if not impossible. Various methods of magnifying the indicia have been tried, but for the most part magnifying lenses and the like have proved economically impractical.

One practical solution to this problem has been to develop fiber optic display devices. Broadly speaking, a fiber optic display device includes a fiber optic bundle composed of a plurality of light transmitting fibers. A source of illumination is provided to iluminate the light input end of the bundle and a mask is interposed between the light and the input end of the bundle such that only selected fibers are illuminated. The output end of the fiber optic bundle is situated in a display area with the output ends of the fibers arranged in a preselected pattern. The output ends of the illuminated fibers form a numeral display which corresponds to the channel which is selected. By moving the mask, different fibers may be illuminated thus creating a different numeral in the display area. This method has proven feasible because it requires a relatively small space, can be produced economically and by spreading out the output ends of the fibers an apparent magnification can be achieved such that the numerals displayed are of adequate size.

Although there are seventy available channels in the UHF band, any particular reception area can only receive a limited number of these channels. Thus, for instance, there may be only six or eight UHF channels actually being used in a particular area. Because of this, certain UHF tuner drive assemblies have been designed to be programmable to receive only a limited number of UHF channels. These tuners are normally made with an adjustable tuner drive mechanism so that they can be produced for nationwide distribution and upon installation adjusted to receive the UHF channels which are being broadcast in the particular reception area.

Whether a UHF tuner is designed to receive all of the seventy channels or only a limited number thereof, it is obvious that the channel indicia display need only display numerals which correspond to channels which can be received in the particular reception area. If a tuner is designed to receive all UHF channels sequentially, the design of a display device is simply a sequential numbering system. Sometimes it is advantageous from a human factors point to supply instead of all seventy channel positions, perhaps eight to twelve positions, that would be capable of selecting any of the seventy UHF channels. This mechanism however requires that each of the several positions be able to display any UHF channel number. This could be done by supplying at a cost and complexity, a multiplicity of display devices, one for each position. These drawbacks are particularly burdensome in view of the fact that a great deal of the display capability of such a device is not utilized. The display could also be done by "stick-on" numbers or insertable tabs, but these methods are not conductive to changing the channel number for a particular position. An option to such a display device would be a customer adjustable low inertia device that can be set at every position to read any channel number. Further, since two separate digits, a units digit and a tens digit, must be displayed simultaneously, the device must be capable of displaying a numeral with the digits properly registered with respect to each other and further, the numeral itself must demonstrate the proper registration with the display area. In addition, the size of the numerals displayed must be adequate to be intelligible at appreciable distances from the receiver.

When using only eight of the seventy UHF channels it is convenient to combine with the twelve channel VHF tuner to create a twenty position tuner. This tuner must be capable of displaying any number in the UHF and VHF bands from two to eighty-three.

It is, therefore, a prime object of the present invention to provide a UHF channel indicia display which is capable of being customer programmed to display a selected limited number of indicia corresponding to the available UHF channels in a particular reception area.

It is another object of the present invention to provide a singular channel display for use with a combined UHF and VHF tuner and capable of displaying the channel number corresponding to twelve VHF and approximately eight UHF channels, the UHF portion thereof being customer programmable.

It is still another object of the present invention to provide a UHF channel indicia display capable of displaying two digit indicia wherein proper registration between the digits themselves as well as between the indicia and the display area is maintained.

It is a further object of the present invention to provide a UHF channel indicia display wherein the indicia are evenly illuminated and of sufficient size to be intelligible at a reasonable distance.

It is a still further object of the present invention to provide a UHF channel indicia display device which takes up a minimum amount of space, is constructed of reliable parts and can be economically manufactured by mass production techniques.

It is still another object of the present invention to provide a UHF channel indicia display which can be easily adjusted to display any number of indicia such that it can be used in conjunction with UHF tuners capable of receiving all seventy UHF channels in the UHF band or any selected number thereof.

In accordance with the present invention, a programmable fiber optic display for use in television receivers or the like is provided having a numeral display station, usually in the form of a window. A movable body having a set of position-adjustable elements thereon is operably connected to the tuning device selector shaft to be driven thereby. A carrier is movably mounted on a support and a display element on the carrier has a plurality of indicia spaced thereover. Means are operably drivingly connected to the carrier and positioned to sequentially contact each of the elements as the body is moved. The drive means are effective to move the carrier to various operative positions in accordance with the position of the element contacting the sensing means. Means are provided for operably associating the carrier and the display station and are effective to exhibit at the display station that particular indicia on the carrier corresponding to the then operative position of the carrier.

The display element comprises a mask with its indicia defined by areas having light transmissive properties differing from their surroundings. A source of illumination is located to one side of the mask. The means for operably associating the carrier and the display window takes the form of a fiber optic bundle. The fiber optic bundle has a light input end located on the side of the mask opposite the illumination source. The fiber optic bundle transmits light to its output end located at the display window.

Preferably, the movable body has two separate sets of position-adjustable elements thereon. One element in one set is utilized in the display of a units digit and one element in the other set is utilized in the display of a tens digit for each numeral displayed. Thus a pair of elements, one from each set, is necessary to display a two digit numeral. Separate carriers, display elements, drive means and fiber optic bundles are also provided for the units and tens digits respectively. By adjusting the position of each of the adjustable elements, the display may be programmed to display any one of a selected number of indicia corresponding to the channels available in the particular reception area in which the receiver is used.

The present invention can be utilized to display a limited number of UHF channels only or both the complete set of VHF channels and a limited number of UHF channels. When used in the latter application, the VHF portion need not be customer programmable since it would be designed to display all of the VHF channel numbers sequentially, However, the UHF portion would necessitate programming as indicated above. Although the present invention can be used equally well in both applications, for purposes of illustration this disclosure is directed to the use of the present invention in conjunction with a mechanism capable of tuning only the UHF channels. However, by utilizing a tuning mechanism capable of tuning both VHF and UHF channels, the device can be used to display all of the VHF channels in addition to selected UHF channels.

To the accomplishment of the above, and to such other objects as may hereinafter appear, the present invention relates to a programmable channel indicia display device for use in television receivers as defined in the appended claims and as described in the specification, taken together with the accompanying drawings in which:

Figure 1:
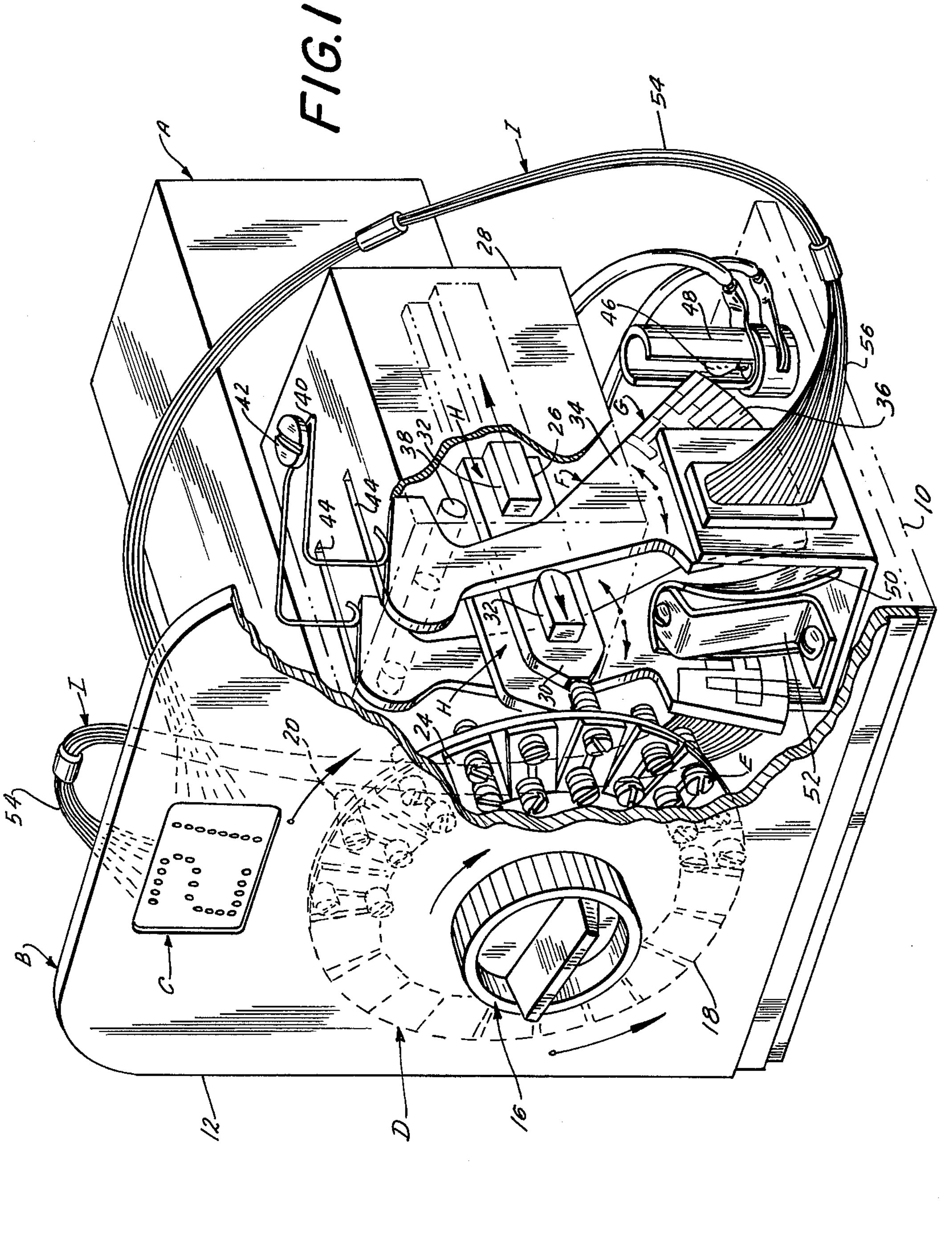
FIG. 1 is an isometric view of a preferred embodiment of the present invention.

The programmable fiber optic display of the present invention is designed for use in conjunction with a tuner drive assembly utilized to corporeally condition a tuning element to select a particular broadcast frequency. Since neither the tuner drive assembly nor tuning element itself form any part of the present invention, neither is illustrated in detail in the drawings and both are depicted as situated within a box-like enclosure, generally designated A in FIG. 1. Although the present invention is particularly suited for use in conjunction with a UHF tuning element driven by a tuner drive assembly capable of conditioning the element to select only a limited number of channels in the UHF band, it should be understood that the present invention may also be utilized in conjunction with tuner drive assemblies and UHF tuning elements capable of selecting any one of the possible seventy UHF channels as well as with VHF tuner drive assembly and tuning element combinations or tuner drive assemblies with drive tuning capable of selecting channels in both the VHF and UHF bands. Further, as will be appreciated as the present invention is described in detail, simple structural modifications, not involving the inventive concept of the present invention, can be easily made to the disclosed structure to provide a mechanism capable of displaying as many two digit indicia as required by the particular tuner drive mechanism and tuning element utilized in conjunction therewith. Moreover, through the duplication of elements, displays for other purposes requiring three or more digits may also be achieved.

The display includes a support, generally designated B, including a front panel having an aperture or transparent portion which forms a dispslay station or window, generally designated C. A channel selector shaft is operably connected to drive the tuner drive assembly to corporeally condition the tuning element. Mounted on the channel selector shaft is a body, generally designated D, which is moved by the rotation of the tuning selector shaft. Body D is provided with a set of position-adjustable elements, generally designated E.

A movable carrier, generally designated F, is also mounted on support B. Carrier F is provided with a display element, generally designated G, which has a plurality of indicia spaced thereon. Drive means, generally designated H, are operably drivingly connected to carrier F and positioned to sequentially contact each of the elements E as body D is moved in accordance with the rotation of the tuner selector shaft. Drive means H are effective to move carrier F to various operative positions in accordance with the position of the particular element E in contact with drive means H. Means, generally designated I, are provided for operably associating the carrier F and the display window C. Means I are effective to exhibit at the display window C that particular indicia on the carrier F which corresponds to the then operative position of carrier F.

More specifically, the box-like structure A, which houses the tuner drive assembly and the tuning element, is situated within support B which comprises a bottom section 10 and a front panel 12. Front panel 12 is made of an opaque material and may be a separate structure affixed to the receiver enclosure or a portion of the enclosure itself. Front panel 12 is provided with a transparent portion which forms display station or window C. Display window C may simply be an aperture in front panel 12 or may be a portion of panel 12 formed of any transparent material such as plastic or glass. Display window C may have any shape desired as long as it is at least large enough to permit the display of a two digit number of adequate size for comfortable viewing. In the drawings, display window C is shown to have a generally rectangular shape with rounded corners. Display window C may be situated anywhere on front panel 12. Flexibility in the positioning of display window C on front panel 12 is an advantage of fiber optic type displays such as the one described herein. The designer of the receiver may advantageously utilize this character to position display window 12 to create an aesthetically pleasing enclosure design as well as to achieve readily visibility of the display window C. In the drawings, display window C is shown as being placed above the tuner control in a manner common in the industry.

As is conventional, channel selection is accomplished through the step-by-step, usually detented or indexed, rotation of a channel selector shaft 14. Selector shaft 14 is operably connected to the tuner drive assembly in box-like structure A such that the rotation thereof will operate the assembly to corporeally condition the tuning element to select the desired channel. A tuner selector knob 16 is mounted on the accessible end of shaft 14 in the well-known manner to facilitate manipulation of shaft 14 and thus channel selection.

Body D is fixedly mounted on shaft 14 behind front panel 12 such that the rotation of shaft 14 will also rotate body D. Preferably, body D takes the form of a disc 18. The diameter of disc 18 is determined by the number of position-adjustable elements E which must be carried thereby. Position-adjustable elements E may conveniently take the form of screws 20 which are mounted within internally threaded apertures 22 situated in a circular configuration along the surface of disc 18. One set of screws 20 formed in a circular configuration is provided for each digit to be displayed. Since the display illustrated is designed for two digit display, two sets of screws 20 are provided along the surface of disc 18. The outer circular set of screws 20 will control the units digit of the display, while the inner circular set of screws 20, which is concentric with the outer set, will control the tens digit of the display. The head of each of the screws 20 is provided with a driveable shape to permit engagement with a tool, such as a screwdriver, in order that the screw may be rotated to change its axial position with respect to the surface of disc 18.

As can be seen from the drawings, one screw 20 from the outer circular set corresponds to each screw 20 from the inner circular set. The corresponding screws in the sets are radially aligned. Each radially aligned pair corresponds to a single numeral to be displayed, the outer screw 20 in the pair providing to the units digit of the numeral while the inner screw 20 of the pair provides to the tens digit. Each radially aligned pair of screws 20 is provided with a novel self-locking tab 24 in planar alignment with the surface of disc 18. Each tab has two apertures, each of which is aligned with a different one of the apertures 22 in which the screws 20 in the radial pair are situated. Tab 24 serves to lock screws 20 in the rotational position in which they are set such that axial movement of screws 20 with respect to the surface of disc 18 is prevented except when the screws are rotated by the appropriate tool as described above. The basic principle of function is that the plate is distorted out of the original flat configuration when the screw is threaded into it, thereby creating a drag on the screws.

Figure 2:
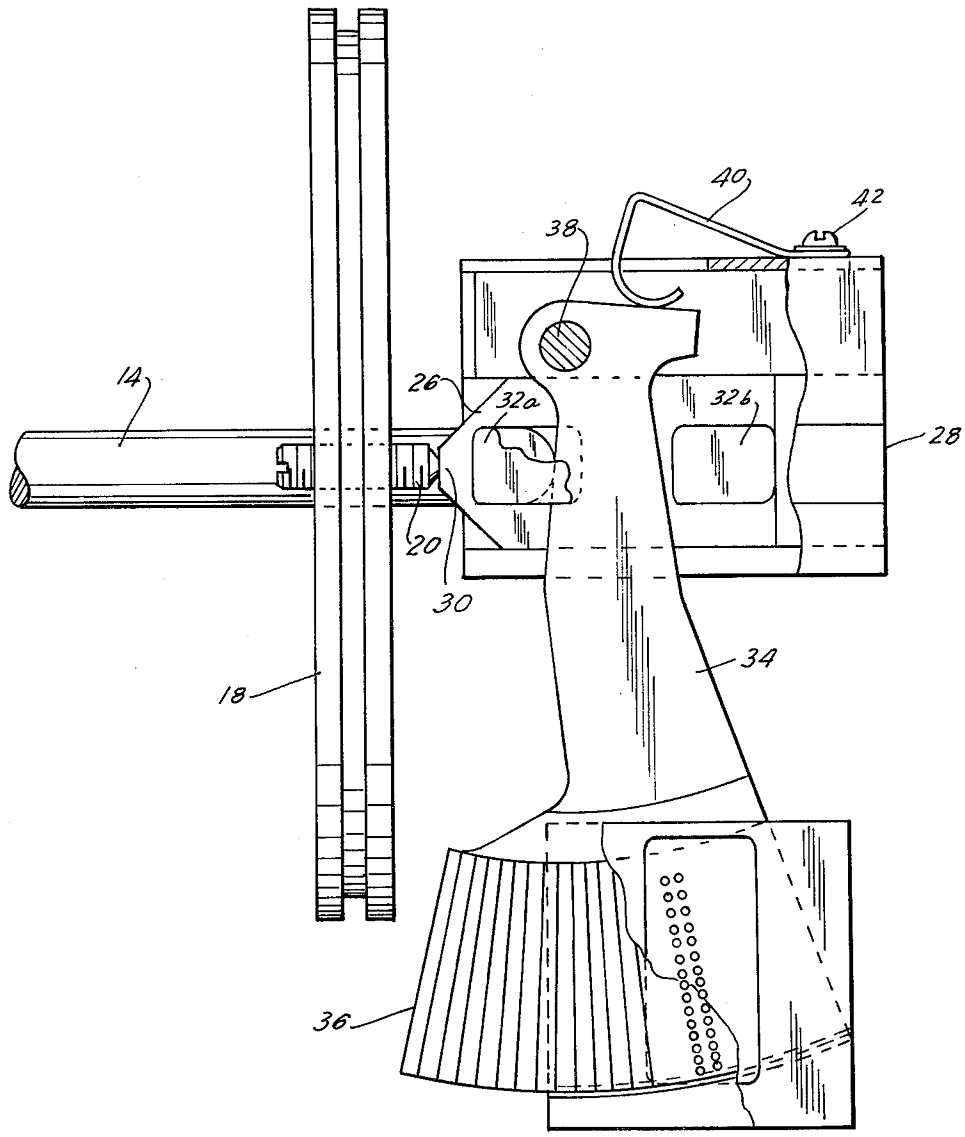
FIG. 2 is a side view of the movable body, carrier means and sensing means of a preferred embodiment of the present invention.

Screws 20 extend from the rear surface of disc 18 toward the back of the receiver (right as seen in FIG. 2) such that each of the screws in the radially aligned pair situated in the operative position will contact a different one of the two drive means H arranged in a side-by-side relationshsip. Each of the drive means H comprises a body 26 which is slidably mounted on a structure 28 which forms a portion of support B. The end of body 26 closest to disc 18 is provided with a tapered portion 30, preferably having a flat nose. Each tapered portion 30 is positioned with respect to disc 18 such that the nose thereof contacts a different one of the screws 20 in the operative position. One drive means H is provided for each circular set of screws 20 mounted on disc 18. Body 26 is provided with a pair of spaced protrusions 32*a* and 32*b*, each of which extends outwardly in a perpendicular manner on the side of body 26 opposite to the side thereof which slidingly engages structure 28. Protrusions 32a and 32b are spaced along the surface of body 26 to permit a portion of carrier F to be situated therebetween.

Each carrier F comprises an elongated portion 34 and an indicia carrying portion 36. A shaft 38 is provided within structure 28. Each end of shaft 38 is fixedly mounted to the interior of one of the opposing walls of structure 28, as can be best seen in FIG. 3. The upper section of elongated portion 34 of each carrier F is pivotally mounted on shaft 38 such that carriers F may be independently pivoted with respect to shaft 38. The top edge of elongated portion 34 of each carrier preferably has a planar configuration.

A spring 40 is provided, one end of which is attached to the top surface of structure 28 in any conventional manner, such as a screw 42 shown in the drawings. Spring 40 has two legs, each of which bears on the top planar edge of elongated portion 34 of each carrier such that carriers F are urged to rotate in a clockwise direction (as shown in FIG. 2). A pair of elongated apertures 44 are provided on the top surfacce of structure 28 to permit the legs of spring 40 to extend through the top surface of structure 28 and contact the top edge of elongated portion 34 of the carriers. The clockwise rotation of carriers F causes elongated portion 34 of each carrier to bear against the front protrusion 32*a* of the sensing means H associated therewith. Thus, spring 40 causes each carrier F to urge the drive means H associated therewith into contact with the appropriate screw 20 on disc 18. One carrier F is provided for each circular set of screws on disc 18, and therefore two carriers F are illustrated in the drawings.

The indicia carrying portion 36 of each carrier F is essentially a mask which is divided into a plurality of masking strips each one of which is bounded on either side by one radius of a circle, the center of which is preferably located at shaft 38. Thus, each of the masking strips is not purely a rectangle, but one end thereof is slightly wider than the other such that each strip is formed of a thin segment of a circle. Each masking strip is divided into radial portions which may either by opaque or transparent. Indicia carrying portion 36 is preferably formed of standard photographic film which has been exposed to a master and then developed. However, masks or this type could be produced by hot stamping, silk screening, plating or metal punching, all of these processes producing the desired results.

A light source in the form of a bulb 46 and a reflector 48 is positioned beneath structure 28 and designed to project a beam of light between the two carriers F. Located between the two carriers F is a reflector 50 supported by a stand 52. Reflector 50 is designed to split the beam of light from bulb 46 and redirect the split light beam in opposite directions perpendicular to the original beam thereby illuminating each carrier with a light beam incident to the indicia carrying portions 36 of each of the carriers F in an essentially perpendicular direction.

Figure 3:
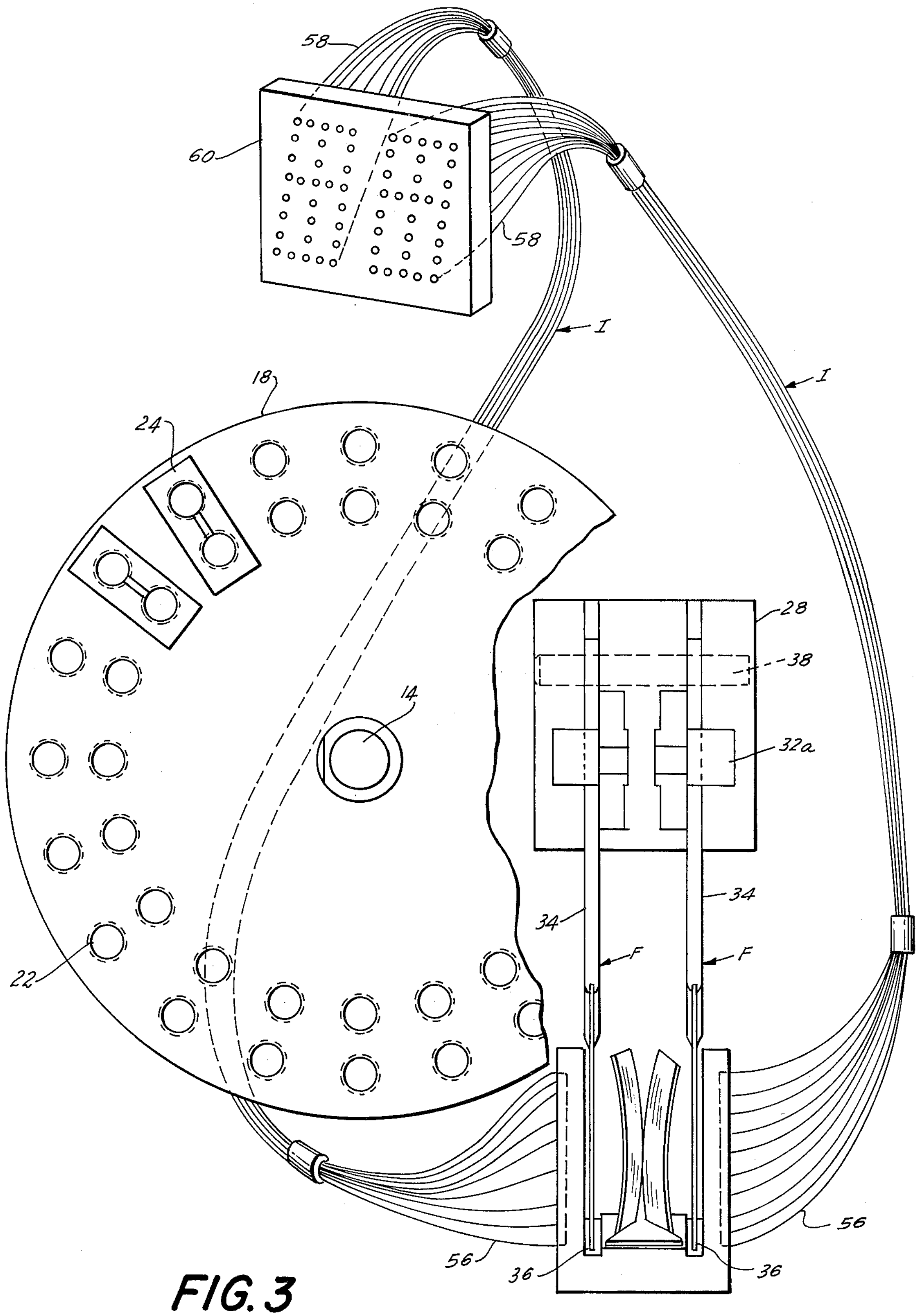
FIG. 3 is a front view of the portions of a preferred embodiment of the present invention shown in FIG. 2 also including the fiber optic bundles and display window.

Means I preferably takes the form of a pair of fiber optic bundles 54 each having a light input end 56 and a light output end 58. The fibers which make up fiber optic bundle 54 are preferably 0.02 inches in diameter, having an optically clear core and a 0.0005 inch coating of a material having a lower refractor index than the core material. For these types of fibers, light loss is approximately 15% in lengths which are conventionally utilized in this application. Further, the fiber bundle is reasonably flexible to permit positioning of display window C on front panel 12 in any location desired. As shown in FIG. 3, the output end 58 of the fiber optic bundles 54 terminates in a block of plastic 60. A diffusion screen is placed in front and in intimate contact with block 60 to increase the viewing angle. Block 60 and the diffusion screen are situated directly behind display window C.

Fiber optic bundle 54 may consist of as many fibers as desired; however, it has been found that an aesthetically pleasing display may be formed by bundles having thirty fibers each. The thirty fibers are arranged into twenty coding units. The twenty code units are arranged such that the fibers form two columns of ten code units each which are spaced from each other in a manner to permit them to align with adjacent masking strips on indicia carrying portion 36. If this configuration is utilized, each of the masking strips is divided into ten radial portions, each of which corresponds to the input end of one code unit. The output end 58 of each bundle may be formed in a pattern consisting of three rows of fibers intersecting three columns. Although it has been found that thirty fibers per bundle is a suitable number of fibers to achieve an aesthetically pleasing digit, this number of fibers is not required by the present invention as the particular coding arrangement utilized for the fibers forms no part of this invention.

Either prior to, during, or at any time after the installation of the television receiver containing the display of the present invention, the screws 20 can be rotated by the user such that the proper axial position for each screw is attained. The proper axial position for each screw is that position which will locate carriers F to cause the device to display the numeral corresponding to the channel selected.

In operation, the knob 16 is rotated to select the desired channel in the conventional manner. Rotation of knob 16 causes simultaneous rotation of disc 18 such that the particular radially aligned pair of screws 20 which corresponds to the channel selected is brought into alignment with the drive means H. In particular, each drive means H is aligned with one of the screws 20 of the radially aligned pair in the operative position. Because of spring 40, each of the carriers F tends to rotate in a clockwise manner such that each of the drive means is urged forward to contact the screw aligned therewith. As disc 18 is rotated, the tapered edge 30 of each body 26 permits the tip of the screw 20 to ride up the inclined edge of the taper thus caming body 26 out of the way until the screw reaches the flat tip of tapered edge 30. In order to assure the appropriate alignment of the screw with the flat edge of tapered portion 30, a detent mechanism of the well-known type may be utilized, for example, a star wheel acting in conjunction with a spring loaded detent member. Since most tuner drive assemblies incorporate some sort of a detent mechanism, this same mechanism may be used to align the screws with drive means H.

The axial position of each of the radially aligned screw will serve to position a different one of the drive means independently and thereof each of the carriers F individually. The positioning of each carrier F will in turn bring into alignment the appropriate mask strips on indicia carrying portion 36 with the input end 56 of each fiber optic bundle. Since bulb 46 is energized when the receiver is turned on, reflector 50 will serve to direct light to the indicia carrying portion 36 of the carriers F. The opaque portions of the mask strips on the indicia carring portion 36 aligned with the input end 56 of the fiber optic bundle will block the light directed from reflector 50 from certain of the fibers while the transparent portions thereof permit light from reflector 50 to illuminate certain other of the fibers. The illuminated fibers will transmit the light from input end 56 to output end 58 thereby illuminating selected points in the display window C to form a numeral. Each fiber optic bundle 54 will form a separate numeral in display window C. Preferably, these numerals will be in a side-by-side relationship.

In the embodiment illustrated, the input end 56 of each fiber optic bundle is divided into two columns of fibers, therefore two masking strips on carrier 36 are necessary for each numeral. Since the combined UHF and VHF bands cover channels two to eighty three, the carrier F corresponding to the units digits may have twenty masking strips to cover zero through nine, and the carrier F corresponding to the tens digit may have eighteen masking strips to cover "blank" through eight permitting display of a numeral corresponding to any one of the eighty-two possible television channels. However, the masking configuration on each of the indicia carrying portions 36 forms no portion of the present invention and may be designed to achieve whatever results the particular display device desired.

The present invention provides a channel indicia display which is capable of being customer programmed to display a selected number of indicia corresponding to the available channels in a particular reception area. Further, the present invention is capable of displaying two digit indicia having proper registration between the digits themselves as well as between the indicia and the display area. The indicia displayed are evenly illuminated and apparent magnification may be achieved by spreading the output end 58 of the fibers. The display device is designed to take up a minimum amount of space, is constructed of reliable parts which can be economically manufactured by mass production techniques. Further, the display is versatile enough to be utilized either with tuning mechanisms capable of receiving only a limited number of UHF stations, or a combined UHF and VHF tuner.

A single preferred embodiment of the present invention has been specifically disclosed herein for purposes of illustration. It is apparent that many modifications and variations may be made upon the specific structure disclosed herein. It is intended to cover all of these variations and modifications which fall within the scope of this invention as defined by the appended claims.

We claim:

1. In a TV tuner or the like comprising a movable tuning shaft and tuning control means operatively connected thereto for controlling the tuning of the TV set in accordance with the movement of the tuning shaft; the improvement which comprises a programmable fiber optic display comprising a support having a display station, and a movable body having a set of position adjustable elements thereon, said body being operatively connected to said shaft to be driven thereby, a movable display element having a plurality of indicia spaced thereover, drive means operatively connected to said display element independently of said tuning control means and positioned to sequentially contact each of said position adjustable elements as said body is moved, said drive means being effective to move said display element to various operative positions in accordance with the position of the position adjustable element contacting said drive means, fiber optic means for optically connecting said display element and said display station, and means for illuminating said display element, said display element being effective to mask selected portions of said fiber optic means, such that selected areas of said display station corresponding to the then operative position of said display element are illuminated.

2. The display of claim 1 in which said display elements comprises a mask with its indicia defined by areas having light transmissive properties differing from their surrounding, a source of illumination located to one side of said mask, and light transmissive means located to the other side of said mask and extending to said display station.

3. The display of claim 2 wherein said drive comprises a slidably mounted member having a cam follower portion, said cam follower portion being positioned to sequentially contact each of said position-adjustable elements as said body is moved.

4. In the display of claim 3, a carrier having a pivotally mounted neck portion and a display element mounting portion on which said display element is mounted, said neck portion contacting said slidably mounted member, whereby the movement of said member causes said neck portion to pivot.

5. The display of claim 4 further comprising biasing means active on said neck portion to urge said slidably mounted member towards said position-adjustable elements.

6. In the display of claim 2, a second mask movably mounted on said support and having a second plurality of indicia thereon, said movable body having a second set of position-adjustable elements thereon, second sensing means, and second means operably associating said second mask and said display station, the indicia on said masks respectively being simultaneously displayed at said display station, thereby to represent units and tens or the like.

7. The display of claim 6 wherein said drive means comprises a slidably mounted member having a cam follower portion, said cam follower portion being positioned to sequentially contact each of said position-adjustable elements as said body is moved.

8. The display of claim 6, in which both of said masks are located remote from said display station with light transmitting means comprising fiber optic elements between said masks respectively and said display station.

9. The display of claim 8 wherein said drive comprises a slidably mounted member having a cam follower portion, said cam follower portion being positioned to sequentially contact each of said position-adjustable elements as said body is moved.

10. In the display of claim 8 a carrier having a pivotally mounted neck portion and a display element mounting portion on which said display element is mounted, said neck portion contacting said slidably mounted member, whereby the movement of said member causes said neck portion to pivot.

11. The display of claim 9 further comprising biasing means active on said neck portion to urge said slidably mounted member towards said position-adjustable elements.

12. In the display of claim 11, a carrier having a pivotally mounted neck portion and a display element mounting portion on which said display element is mounted, said neck portion contacting said slidably mounted member, whereby the movement of said member causes said neck portion to pivot.

13. The display of claim 12 further comprising biasing means active on said neck portion to urge said slidably mounted members towards said position-adjustable elements.

14. The display of claim 1 in which said mask is located remote from said display station and said light transmitting means comprises fiber optic elements.

15. The display of claim 14 wherein said drive comprises a slidably mounted member having a cam follower portion, said cam follower portion being positioned to sequentially contact each of said position-adjustable elements as said body is moved.

16. In the display of claim 9, a carrier having a pivotally mounted neck portion and a display element mounting portion on which said display element is mounted, said neck portion contacting said slidably mounted member, whereby the movement of said member causes said neck portion to pivot.

17. The display of claim 16 further comprising biasing means active on said neck portion to urge said slidably mounted member towards said position-adjustable elements.

18. The display of claim 1 wherein said drive comprises a slidably mounted member having a cam follower portion, said cam follower portion being positioned to sequentially contact each of said position-adjustable elements as said body is moved.

19. In the display of claim 1, a carrier having a pivotally mounted neck portion and a display element mounting portion on which said display element is mounted, said neck portion contacting said slidably mounted member, whereby the movement of said member causes said neck portion to pivot.

20. The display of claim 19 further comprising biasing means active on said neck portion to urge said slidably mounted member towards said position-adjustable elements.

21. The display of claim 1 in which each of said display elements comprise a mask with its indicia defined by areas having light transmissive properties differing from their surrounding, and wherein said optical associating means comprises a source of illumination located to one side of said mask, and light transmissive mans located on the other side of said mask and extending to said display station.

22. Device for displaying a number having individually programmable multiple digits for use in a television tuner or the like comprising a support having a display station, a tuning shaft movably mounted on said support, a movable body having a plurality of sets of position adjustable elements thereon, each of said sets comprising an independently adjustable element for each of the digits to be displayed, said body being operably connected to said shaft to be driven thereby, a plurality of independently movable display elements, each having a plurality of indicia present thereon, one of said display elements being provided for each of said adjustable elements, drive means independently operatively connected to each of said display elements and positioned to sequentially contact each of said adjustable elements in each of said sets as said body is moved, said drive means being effective to independently move each of said display elements to various operative positions in accordance with the position of the adjustable element corresponding to that display element and fiber optic means separately optically connecting each of said display elements and said display station, said display element being effective to mask selected portions of said fiber optic means such that the digits are exhibited in a side-by-side relationship at said display station by illuminating selected areas of said display station corresponding to the then operative positions of said display elements, respectively.

23. The display of claim 22 wherein said body is a disc and said sets are angularly spaced on the surface of said disc.

24. The display of claim 23 wherein said adjustable elements in each set are radially aligned.

* * * * *